(12) United States Patent
Danilak

(10) Patent No.: US 7,904,672 B2
(45) Date of Patent: Mar. 8, 2011

(54) SYSTEM AND METHOD FOR PROVIDING DATA REDUNDANCY AFTER REDUCING MEMORY WRITES

(75) Inventor: Radoslav Danilak, Cupertino, CA (US)

(73) Assignee: SandForce, Inc., Milpitas, CA (US)

( * ) Notice: Subject to any disclaimer, the term of this patent is extended or adjusted under 35 U.S.C. 154(b) by 453 days.

(21) Appl. No.: 11/942,629

(22) Filed: Nov. 19, 2007

(65) Prior Publication Data

US 2008/0141055 A1 Jun. 12, 2008

Related U.S. Application Data

(60) Provisional application No. 60/873,630, filed on Dec. 8, 2006.

(51) Int. Cl.
*G06F 12/00* (2006.01)
(52) U.S. Cl. ........................................ 711/154
(58) Field of Classification Search .................. None
See application file for complete search history.

(56) References Cited

U.S. PATENT DOCUMENTS

| | | | | |
|---|---|---|---|---|
| 5,315,602 A * | 5/1994 | Noya et al. | ................ | 714/766 |
| 5,485,595 A | 1/1996 | Assar et al. | ................ | 395/430 |
| 5,544,356 A | 8/1996 | Robinson et al. | ............. | 395/600 |
| 5,568,423 A | 10/1996 | Jou et al. | ................ | 365/185.33 |
| 5,568,626 A | 10/1996 | Takizawa | ................ | 395/430 |
| 5,621,687 A | 4/1997 | Doller | ................ | 365/185.29 |
| 5,680,579 A * | 10/1997 | Young et al. | ................ | 711/157 |
| 5,819,307 A | 10/1998 | Iwamoto et al. | ............. | 711/103 |
| 5,835,935 A | 11/1998 | Estakhri et al. | ............. | 711/103 |
| 5,881,229 A | 3/1999 | Singh et al. | ............. | 395/200.33 |
| 5,956,473 A | 9/1999 | Ma et al. | ................ | 395/182.03 |
| 5,963,970 A | 10/1999 | Davis | ................ | 711/103 |
| 6,000,006 A | 12/1999 | Bruce et al. | ................ | 711/103 |
| 6,154,808 A | 11/2000 | Nagase et al. | ................ | 711/103 |
| 6,195,727 B1 * | 2/2001 | Islam et al. | ................ | 711/114 |
| 6,230,233 B1 | 5/2001 | Lofgren et al. | ............. | 711/103 |
| 6,405,295 B1 | 6/2002 | Bando | ............. | 711/165 |
| 6,539,453 B1 | 3/2003 | Guterman | ............. | 711/103 |
| 6,651,137 B2 * | 11/2003 | Baek et al. | ................ | 711/114 |
| 6,694,402 B1 | 2/2004 | Muller | ................ | 711/103 |
| 6,732,221 B2 | 5/2004 | Ban | ................ | 711/103 |
| 6,831,865 B2 | 12/2004 | Chang et al. | ............. | 365/185.33 |
| 6,914,853 B2 | 7/2005 | Coulson | ................ | 365/236 |
| 6,925,523 B2 | 8/2005 | Engel et al. | ................ | 711/103 |
| 6,948,026 B2 | 9/2005 | Keays | ............. | 711/103 |
| 6,973,531 B1 | 12/2005 | Chang et al. | ................ | 711/103 |
| 6,985,992 B1 | 1/2006 | Chang et al. | ................ | 711/103 |
| 7,000,063 B2 | 2/2006 | Friedman et al. | ............. | 711/103 |
| 7,032,087 B1 | 4/2006 | Chang et al. | ................ | 711/156 |
| 7,035,967 B2 | 4/2006 | Chang et al. | ................ | 711/103 |
| 7,096,313 B1 | 8/2006 | Chang et al. | ................ | 711/103 |
| 7,103,732 B1 | 9/2006 | Chang et al. | ................ | 711/156 |

(Continued)

OTHER PUBLICATIONS

U.S. Appl. No. 11/942,640, filed Nov. 19, 2007.

(Continued)

*Primary Examiner* — Hiep T Nguyen
(74) *Attorney, Agent, or Firm* — PatentVentures: Bennett Smith; Korbin Van Dyke

(57) ABSTRACT

A system, method, and computer program product are provided for providing data redundancy in a plurality of storage devices. In operation, a number of writes to a plurality of storage devices is reduced. Additionally, after the reducing, data redundancy is provided utilizing a data redundancy scheme.

21 Claims, 9 Drawing Sheets

U.S. PATENT DOCUMENTS

| | | |
|---|---|---|
| 7,120,729 B2 | 10/2006 | Gonzalez et al. .............. 711/103 |
| 7,529,970 B2 * | 5/2009 | Hartline et al. ................... 714/6 |
| 7,669,107 B2 * | 2/2010 | Forhan et al. .................. 714/763 |
| 2003/0084397 A1* | 5/2003 | Peleg ............................ 714/770 |
| 2006/0080515 A1* | 4/2006 | Spiers et al. .................. 711/162 |
| 2007/0214316 A1* | 9/2007 | Kim .............................. 711/114 |

OTHER PUBLICATIONS

U.S. Appl. No. 11/942,631, filed Nov. 19, 2007.
U.S. Appl. No. 11/942,623, filed Nov. 19, 2007.

\* cited by examiner

SYSTEM AND METHOD FOR PROVIDING DATA REDUNDANCY AFTER REDUCING MEMORY WRITES

RELATED APPLICATION(S)

The present application claims priority to provisional application Ser. No. 60/873,630 filed Dec. 8, 2006, which is incorporated herein by reference in its entirety for all purposes.

FIELD OF THE INVENTION

The present invention relates to data storage, and more particularly to data redundancy in storage devices.

BACKGROUND

The storage system is one of the most limiting aspects of performance of modern enterprise computing systems. Performance of hard drive based storage is determined by seek time and time for half rotation. The performance is increased by decreasing seek time and decreasing rotational latency. However, there are limits on how fast a drive may spin. The fastest contemporary drives are reaching 15,000 rpm.

FIG. 1 illustrates a system 100 in accordance with the prior art. In the system 100, at least one computer 102-108 is coupled to a host controller 110 and 112. The host controllers 110 and 112 are coupled to a plurality of disks 114-120.

Often, the system 100 is configured as redundant array of independent disks (RAID)-1, storing mirrored content of the disks 114-116 in the disks 118-120. The disks 114-116 are said to be mirrored by the disks 118-120.

Increased reliability of the computer system is achieved by duplicating the disks 114-116, the host controllers 110 and connections therebetween. Therefore, a reliable computer system is able operate at least in presence of single failure of the disks 114-120, the RAID controllers 110 and 112, the computers 102-108, and the connections therebetween. However, storage system performance may still be inadequate using the system 100. Additionally, increasing the performance of such system is currently costly and often times is not feasible.

Furthermore, one limiting aspect of current storage systems is the fact that many types of storage devices exhibit a limited lifetime. For example, a lifetime of non-memory volatile memory such as flash is reduced each time it is erased and re-written. Over time and thousands of erasures and re-writes, such storage systems may become less and less reliable.

There is thus a need for addressing these and/or other issues associated with the prior art.

SUMMARY

A system, method, and computer program product are provided for providing data redundancy in a plurality of storage devices. In operation, a number of writes to a plurality of storage devices is reduced. Additionally, after the reducing, data redundancy is provided utilizing a data redundancy scheme.

DETAILED DESCRIPTION

Figure 2A:
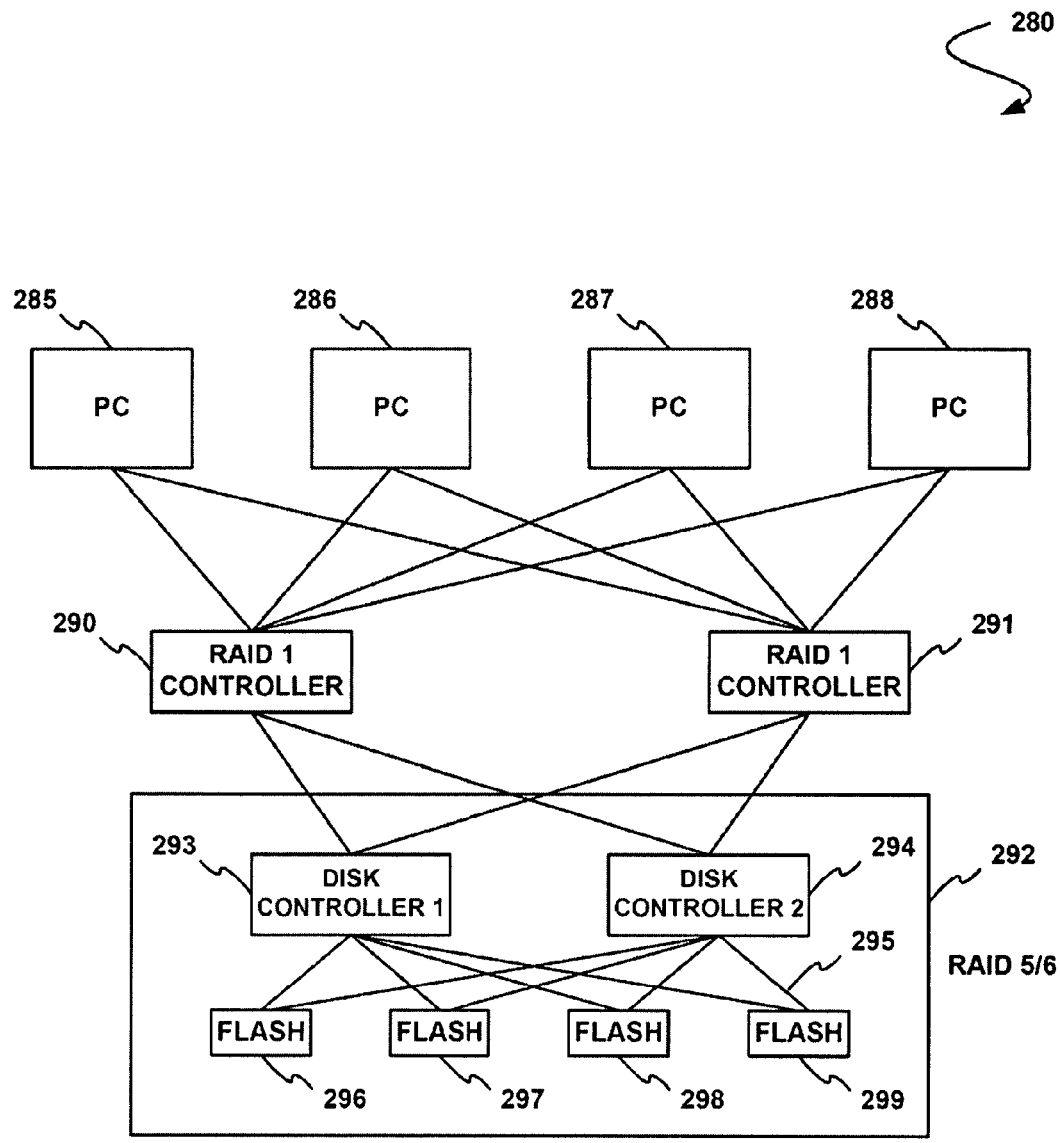
FIG. 2A shows a system for providing data redundancy in a plurality of storage devices, in accordance with one embodiment.

FIG. 2A shows a system 280 for providing data redundancy in a plurality of storage devices, in accordance with one embodiment. As shown, the system 280 includes at least one computer 285-288. The computers 285-288 are in communication with at least one controller 290-291. As shown further, the controllers 290-291 are in communication with a storage system 292 which includes a plurality of disk controllers 293-294 and a plurality of storage devices 296-299. It should be noted that, although the controllers 290-291 are shown separately, in another embodiment such controllers 290-291 may be one unit. Additionally, the plurality of disk controllers 293-294 may be one unit or independent units in various embodiments.

In operation, storage commands are received for providing data redundancy in accordance with a first data redundancy scheme. Additionally, the storage commands are translated for providing the data redundancy in accordance with a second data redundancy scheme. Furthermore, the translated storage commands are outputted for providing the data redundancy in the plurality of storage devices 296-299.

In the context of the present description, storage commands refer to any command, instruction, or data to store or facilitate the storage of data. Additionally, in the context of the present description, a data redundancy scheme refers to any type of scheme for providing redundant data or a fault tolerance in a system. For example, in various embodiments, the data redundancy scheme may include, but is not limited to, a redundant array of independent disks (RAID) 0 data redundancy scheme, a RAID 1 data redundancy scheme, a RAID 10 data redundancy scheme, a RAID 3 data redundancy scheme, a RAID 4 data redundancy scheme, a RAID 5 data redundancy scheme, a RAID 50 data redundancy scheme, a RAID 6 data redundancy scheme, a RAID 60 data redundancy scheme, square parity data redundancy schemas, any non-standard RAID data redundancy scheme, any nested RAID data redundancy scheme, and/or any other data redundancy scheme that meets the above definition.

In one embodiment, the first data redundancy scheme may include a RAID 1 data redundancy scheme. In another embodiment, the second data redundancy scheme may include a RAID 5 data redundancy scheme. In another embodiment, the second data redundancy scheme may include a RAID 6 data redundancy scheme.

Further, in the context of the present description, the plurality of storage devices 296-299 may represent any type of storage devices. For example, in various embodiments, the storage devices 296-299 may include, but are not limited to, mechanical storage devices (e.g. disk drives, etc.), solid state storage devices (e.g. dynamic random access memory (DRAM), flash memory, etc.), and/or any other storage device. In the case that the storage devices 296-299 include flash memory, the flash memory may include, but is not limited to, single-level cell (SLC) devices, multi-level cell (MLC) devices, NOR flash memory, NAND flash memory, MLC NAND flash memory, SLC NAND flash memory, etc.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2B:
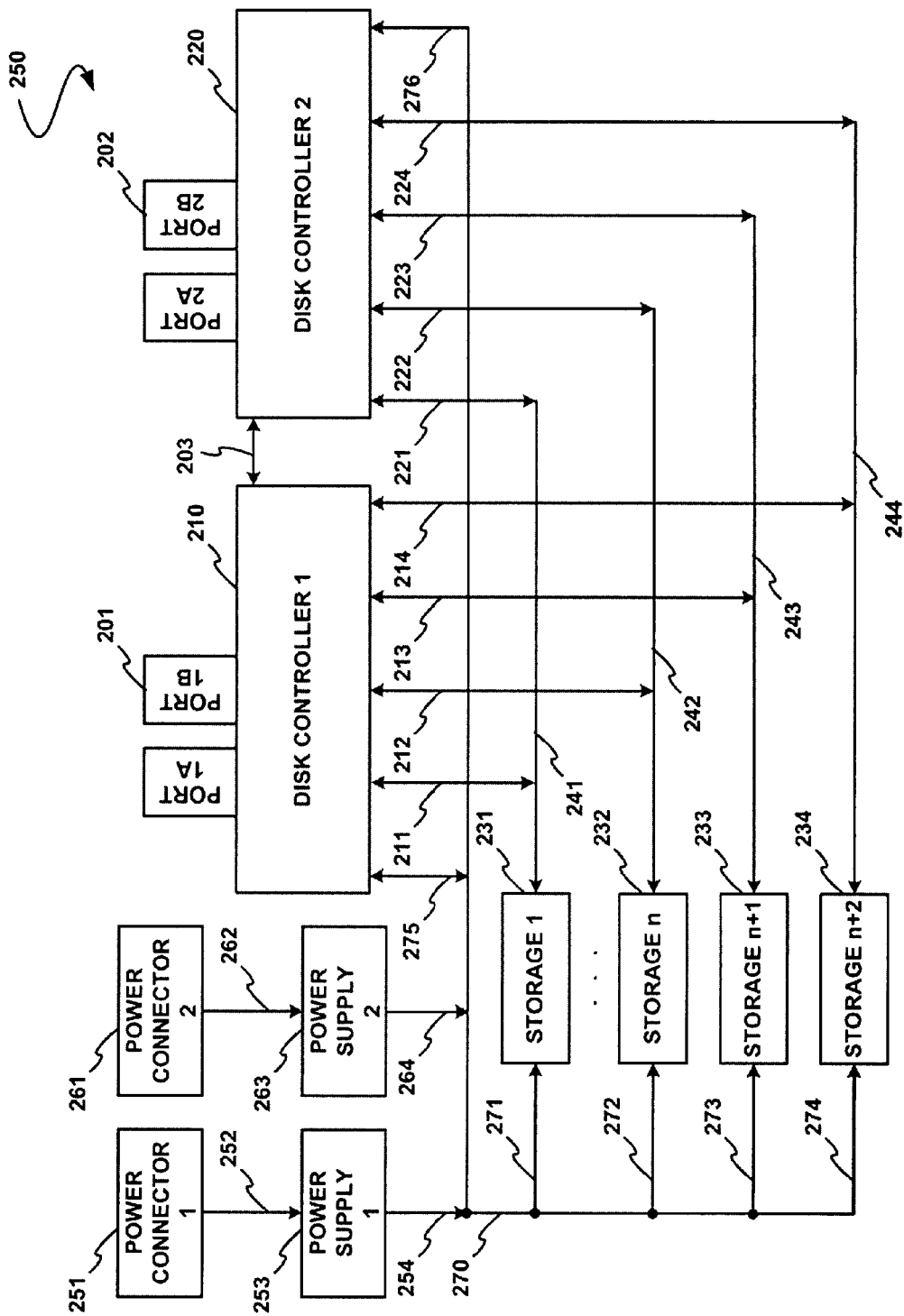
FIG. 2B shows a storage system for providing data redundancy in a plurality of storage devices, in accordance with one embodiment.

FIG. 2B shows a storage subsystem 250 for providing data redundancy in a plurality of storage devices, in accordance with one embodiment. As an option, the storage subsystem 250 may be viewed in the context of the details of FIG. 2A. Of course, however, the storage subsystem 250 may be implemented in the context of any desired environment. It should also be noted that the aforementioned definitions may apply during the present description.

As shown, the storage subsystem 250 includes a plurality of primary storage devices 231-232 and at least one additional storage device 233-234 utilized to increase storage capacity for inclusion of redundant information. The amount of data storage of the storage subsystem 250 may be considered as the sum of the storage capacities of the plurality of primary storage devices 231-232. As an option, the storage capacity may also be expanded through the additional storage device 233-234. Of course, in one embodiment, the additional storage device 233-234 may be used solely to store redundant information computed from stored data.

As shown further, a first disk controller 210 includes at least one port 201. In operation, at least one of the ports 201 may serve as a first port of the storage subsystem 250. Additionally, at least one of the ports 201 may serve as a port of the first disk controller 210 to a disk controller bus 203, power supply connections 275, and internal connections 211-214 coupling the first disk controller 210 to corresponding busses 241-244 of the storage devices 231-234.

The bus 203 couples the first disk controller 210 to a second disk controller 220. In operation, the bus 203 may be used to monitor operation of the first disk controller 210 with the second disk controller 220. When the second disk controller 220 detects a failure of the first disk controller 210, the disk controller 220 may disconnect the internal connections 211-214 from the corresponding busses 241-244 by issuing a disconnect request to the first disk controller 210 via the disk controller bus 203.

The bus 203 coupling the first disk controller 210 to the second disk controller 220 may also be used to monitor operation of the second disk controller 220 using the first disk controller 210. When the first disk controller 210 detects a failure of the second disk controller 220, the first disk controller 210 may disconnect internal connections 221-224 from the corresponding busses 241-244 by issuing a disconnect request to the second disk controller 220 via the disk controller bus 203.

In one embodiment, the first disk controller 210 may detect internal incorrect operation, or incorrect operation associated with the first disk controller 210. In this case, the first disk controller 210 may disconnect the connections 211-214 from the corresponding busses 241-244 when an internal incorrect operation is detected. Similarly, the second disk controller 220 may detect internal incorrect operation, or incorrect operation associated with the second disk controller 220. In this case, the second disk controller 220 may disconnect the connections 221-224 from the corresponding busses 241-244 when an internal incorrect operation is detected.

Additionally, in one embodiment, the first and second disk controllers 210 and 220 may detect a failure of the disk controller bus 203. In this case, the second disk controller 220 may disconnect the connections 221-224 from the corresponding busses 241-244 and the first disk controller 210 may remain active. In another embodiment, the first disk controller 210 may disconnect the connections 211-214 from the corresponding busses 241-244 and the second disk controller 220 may remain active. In still another embodiment, the disk controller that is to remain active may disconnect the connections of the controller that is to be inactive.

It should be noted that the disconnection of the buses 211-214 and 221-224 may be implemented through three state circuits, multiplexers, or any other circuits for disconnecting the busses 211-214 and 221-224. For example, in one embodiment, the disconnection may be accomplished by placing three state bus drivers associated with the disk controllers 210 or 220 into a high impedance state. In another embodiment, the disconnection may be accomplished by controlling multiplexers on an input of the storage devices 231-234.

As shown further, the second disk controller 220 includes at least one port 202. In operation, at least one of the ports 202 may serve as a second port of the storage subsystem 250. Additionally, at least one of the ports 202 may serve as a port of the second disk controller 220 to the disk controller bus 203, power supply connections 276, and internal connections 221-224 coupling the second disk controller 220 to the corresponding busses 241-244 of the storage devices 231-234.

In the case that a single redundant storage device 233 is provided, with no additional redundant storage devices 234, the storage subsystem 250 may operate without a loss of data in the presence of a single failure of any of the storage devices 231-233. In one embodiment, the organization of data and redundant information may be in accordance with RAID 5. In another embodiment, the organization of data and redundant information may be in accordance with RAID 6, RAID 10, RAID 50, RAID 60, square parity redundancy schemas, etc.

In the case that two redundant storage devices 233 and 234 are provided, the storage subsystem 250 may continue to operate without loss of any data in presence of failure of any two of the storage devices 231-234. In operation, the ports 201 and 202 may present data stored in the storage subsystem 250 as two conventional independent mirrored disks. In this case, such conventional independent mirrored disks may appear as RAID 1, RAID 10, RAID 50, RAID 60, square parity redundancy schemas, etc.

The power to the storage subsystem 250 may be supplied through a first power connector 251 coupled to a first power supply unit 253 via electric connections 252. The power to storage subsystem 250 may also be supplied through a second power connector 261 coupled to a second power supply unit 263 via connections 262. As an option, the output of the first power supply 253 and the output of the second power supply 263 may be joined and distributed to the disk controllers 210 and 220 and the storage devices 231-234 through an electric power distribution network 270. The storage devices 231-234 are coupled to the power distribution network 270 via corresponding connections 271-274. The disk controllers 210 and 220 are coupled to the power distribution network 270 via the power supply connections 275 and 276.

In the case that power to the power connector 251 fails, the power to the storage subsystem 250 may be supplied through the power connector 261. Similarly, in the case that power to the power connector 261 fails, the power to the storage subsystem 250 may be supplied through the power connector 251. In the case that the connections 252 fail, the power to the storage subsystem 250 may be supplied through the connections 262. In the case that the connections 262 fail, the power to the storage subsystem 250 may be supplied through the connections 252.

In the case that the power supply 253 fails, power to the storage subsystem 250 may be supplied by the power supply 263. If the power supply 263 fails, power to the storage subsystem 250 may be supplied by the power supply 253. Similarly, when the connections 254 fail, the power to the storage subsystem 250 may be supplied through the connections 264. Likewise, when the connections 264 fail the power to the storage subsystem 250 may be supplied through the connections 254. Thus, the storage subsystem 250 allows for failure of various components, without rendering the storage subsystem 250 inoperable.

In one embodiment, the disk controllers 210 and/or 220 may contain circuits to detect that power to the power supplies 253 and 263 are disconnected. Additionally, such circuits may provide power to save a state of the disk controllers 210 and 220 into the storage devices 231-234 such that no loss of data occurs. For example, a disconnection of the power supply 253 and/or 263 may be detected.

In this case, power may be supplied to the storage devices 231-234, in response to the detection of a disconnection of the power supply 253 and 263. The power supplies 253 and 263 may supply power to the storage subsystem 250 for enough time such that after power to both of the power supplies 253 and 263 is disconnected, writing of the state of the disk controllers 210 and 220 into the storage devices 231-234 may be completed. Thus, power may be provided to the storage devices 231-234 until at least a point when no data loss will occur as a result of the disconnection of the power supplies 253 and 263. In various embodiments, the power supplies 253 and 263 may include a battery, a capacitor, and/or any other component to provide power to the storage subsystem 250 when the power to the power supplies 253 and 263 is disconnected.

It should be noted that the storage subsystem 250 may continue to operate, without a loss of data, in the presence of any single failure of any element illustrated in FIG. 2B. It should also be noted that, in various embodiments, the storage devices 231-234 may be mechanical storage devices, non-mechanical storage devices, volatile or non-volatile storage. Furthermore, it various embodiments, the storage devices 231-234 may include, but is not limited to, DRAM or flash storage (e.g. SLC devices, MLC devices, NOR gate flash devices, NAND gate flash storage devices, etc.).

Furthermore, in one embodiment, the disk controllers 210 and 220 may be implemented as two independent chips. In another embodiment, the disk controllers 210 and 220 may be implemented on one chip or die. Such implementation may be determined based on packaging concerns, for example.

Figure 1:
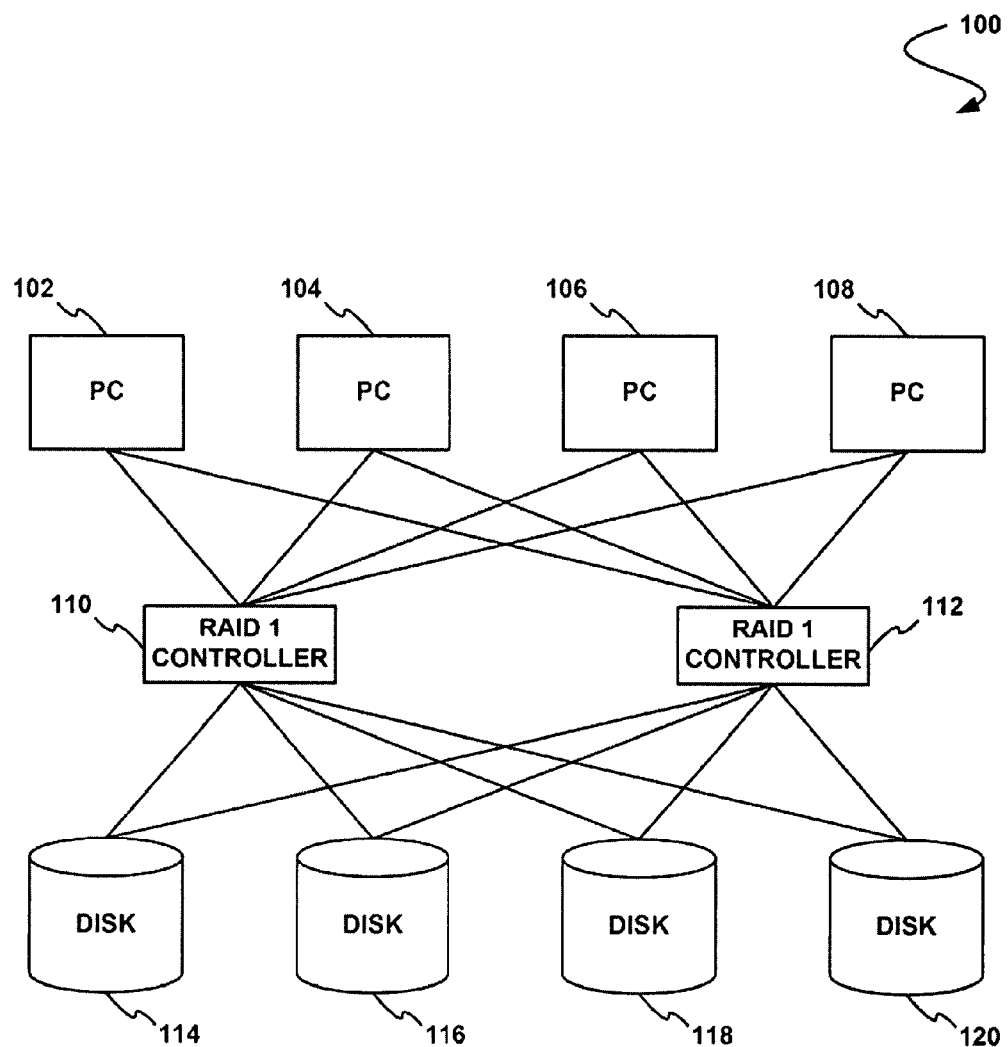
FIG. 1 illustrates a system in accordance with the prior art.
Figure 3:
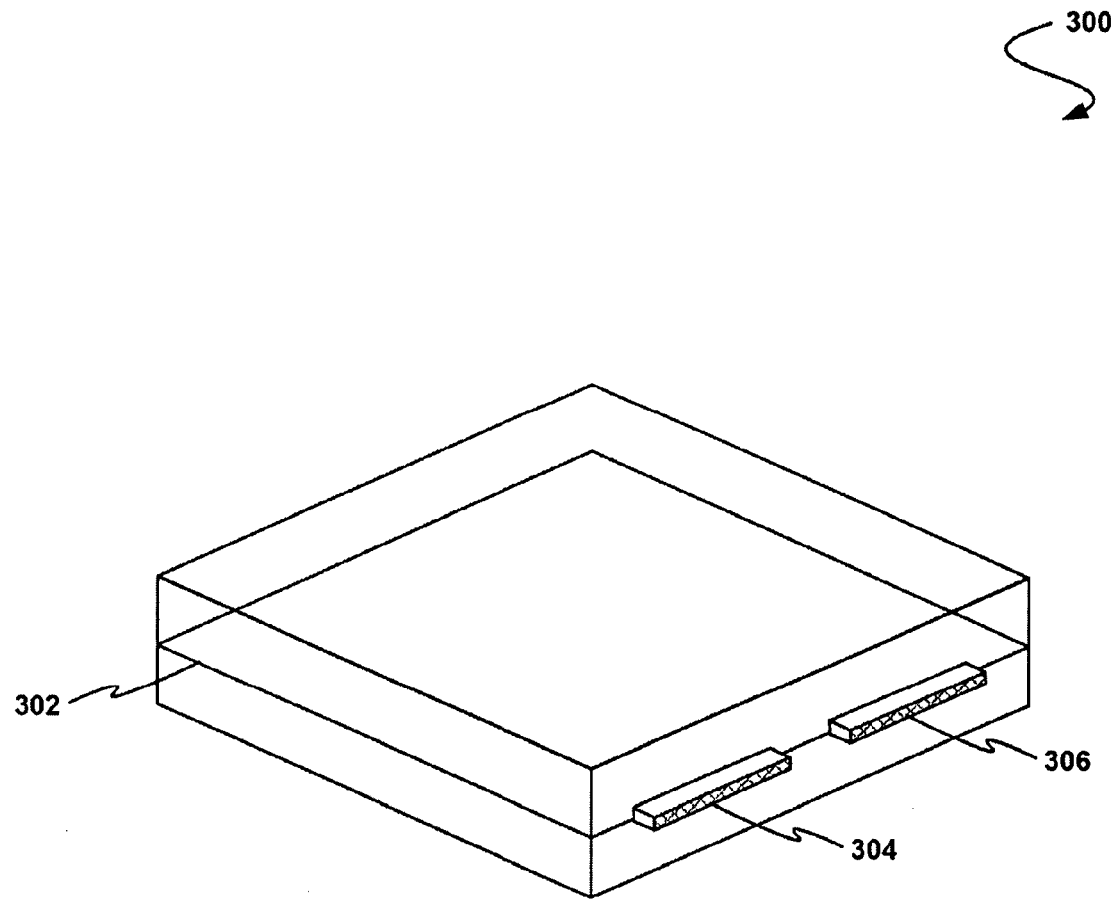
FIG. 3 shows a disk assembly, in accordance with one embodiment.

FIG. 3 shows a disk assembly 300, in accordance with one embodiment. As an option, the disk assembly 300 may be implemented in the context of the functionality and architecture of FIGS. 1-2. Of course, however, the disk assembly 300 may be implemented in the context of any desired environment. It should also be noted that the aforementioned definitions may apply during the present description.

As shown, the disk assembly 300 includes a printed circuit board 302 including a disk drive (not shown), a power connector with primary port as part of a SATA (Serial Advanced Technology Attachment) connector 304 and a power connector with a secondary port as part of a second SATA connector 306. In one embodiment, the disk assembly 300 may include SAS (Serial Attached SCSI) connectors. For example, the disk assembly 300 may include the printed circuit board 302 including a disk drive (not shown), a power connector with primary port as part of a SAS connector 304 and a power connector with a secondary port as part of a second SAS connector 306.

As an option, the connectors 304 and 306 may expose the disk assembly 300 as a certain data redundancy configuration. For example, an SATA interface may expose the disk assembly 300 as a pair of disks configured in a RAID 1 mode. In another embodiment, an SAS interface may expose the disk assembly 300 as pair of disks configured in a RAID 1 mode. In still another embodiment, an SATA and an SAS interface may expose the disk assembly 300 as plurality of disks configured in a RAID 0 mode.

Figure 4:
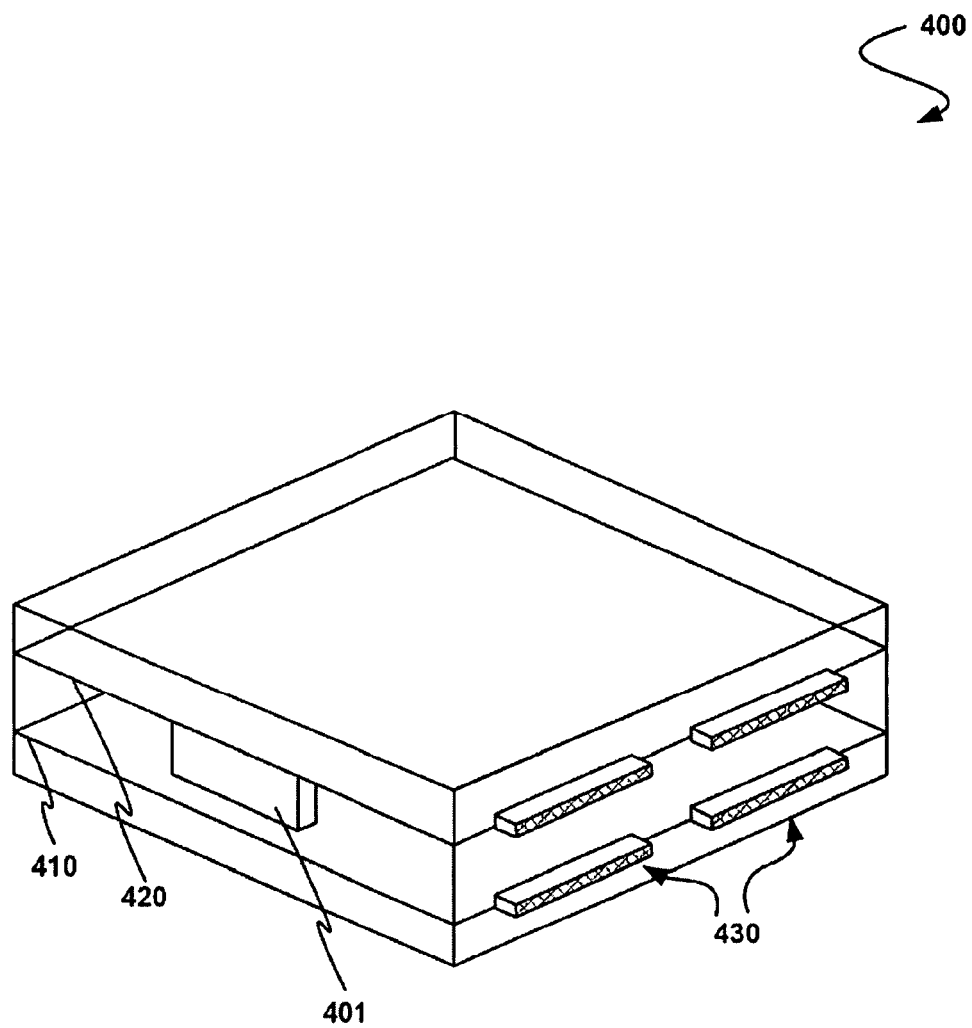
FIG. 4 shows a disk assembly, in accordance with another embodiment.

FIG. 4 shows a disk assembly 400, in accordance with another embodiment. As an option, the disk assembly 400 may be implemented in the context of the functionality and architecture of FIGS. 1-3. Of course, however, the disk assembly 400 may be implemented in the context of any desired environment. It should also be noted that the aforementioned definitions may apply during the present description.

As shown, the disk assembly 400 includes two or more disks assemblies 410 and 420. As an option, the disk assemblies 410 and 420 may include the disk assembly 300 from FIG. 3. In this case, each disk assembly 410 and 420 may include a printed circuit board, and connectors 430.

Optionally, each disk assembly 410 and 420 may be interconnected via an electrical connection 401. In this case, the electrical connection 401 may represent a disk controller bus, such as the disk controller bus 203 of FIG. 2B, for example. In operation, the disk assembly 400 may increase storage performance of a system by allowing more than one disk (e.g. disks assemblies 410 and 420) to occupy a space of a conventional or primary storage (e.g. a disk drive, etc.).

Figure 5:
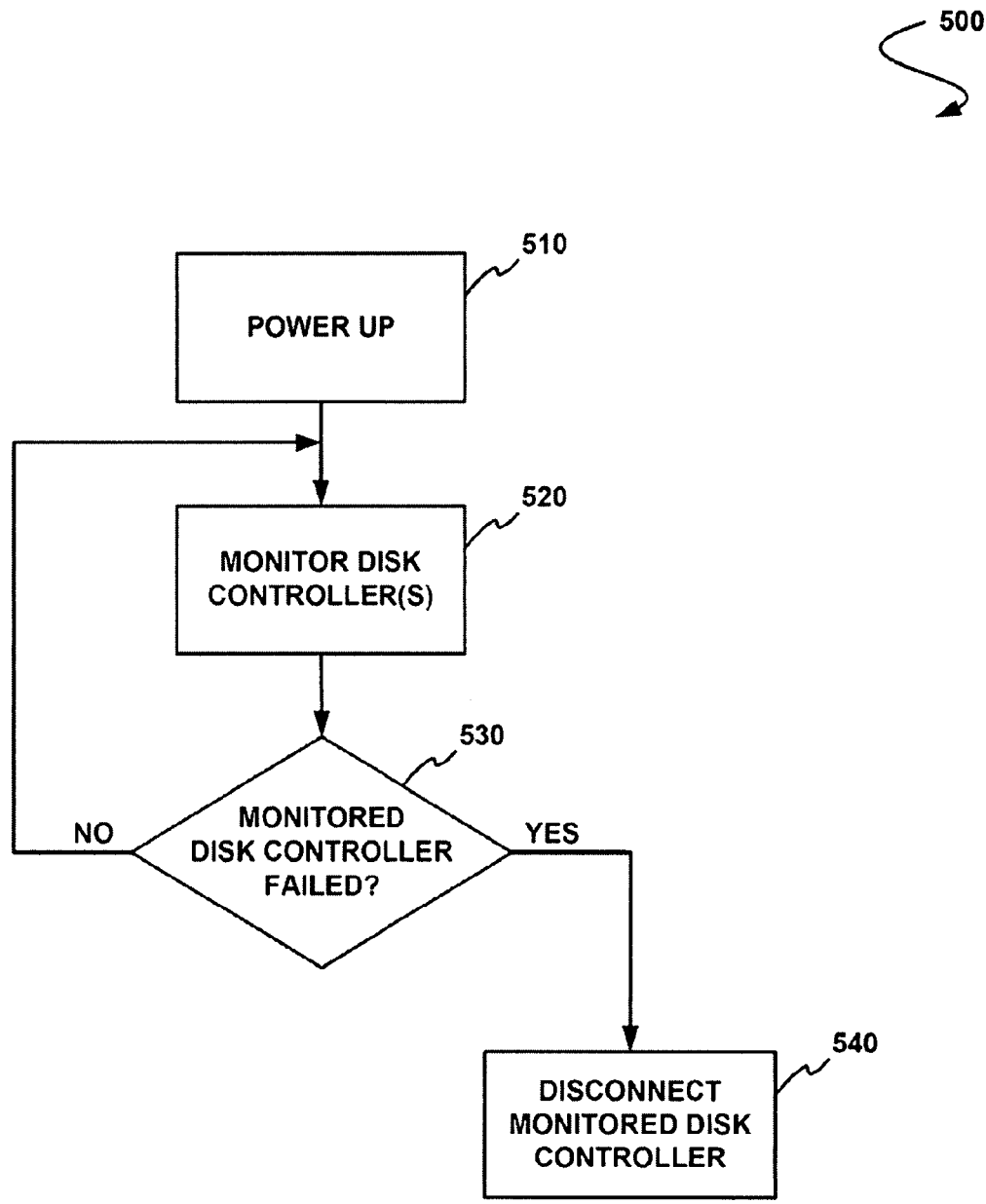
FIG. 5 shows a method for operating a redundant disk controller, in accordance with one embodiment.

FIG. 5 shows a method 500 for operating a redundant disk controller, in accordance with one embodiment. As an option, the present method 500 may be implemented in the context of the functionality and architecture of FIGS. 1-4. Of course, however, the method 500 may be carried out in any desired environment. It should also be noted that the aforementioned definitions may apply during the present description.

As shown, a storage system (e.g. a disk assembly, etc.) is powered up. See operation 510. A disk controller of the storage system is monitored. See operation 520. As an option, the disk controller may be monitored by another disk controller. Such monitoring may include monitoring the disk controller via a bus between the two disk controllers (e.g. the disk controller bus 203 of FIG. 2B, etc.), and/or monitoring activity on busses corresponding to storage devices of the storage system (e.g. busses 241-244 of the corresponding storage devices 231-234, etc.).

The storage system continues to operate, monitoring the disk controller, until it is determined that the monitored disk controller has failed. See operation 530. If the monitored disk controller fails, the monitored disk controller is disconnected. See operation 540.

In one embodiment, the disconnection of the disk controller may be implemented by issuing a disconnect command through the bus between the two disk controllers (e.g. the disk controller bus 203 of FIG. 2B, etc.). In this case, the disconnect command may include disconnecting busses linking the monitored disk controller to the storage devices (e.g. connections 211-214 or 221-224 of FIG. 2B). In one embodiment, a plurality of disk controllers may be monitored by other disk controllers. In this case, each disk controller in the plurality of disk controllers may be considered a monitored disk controller.

Figure 6:
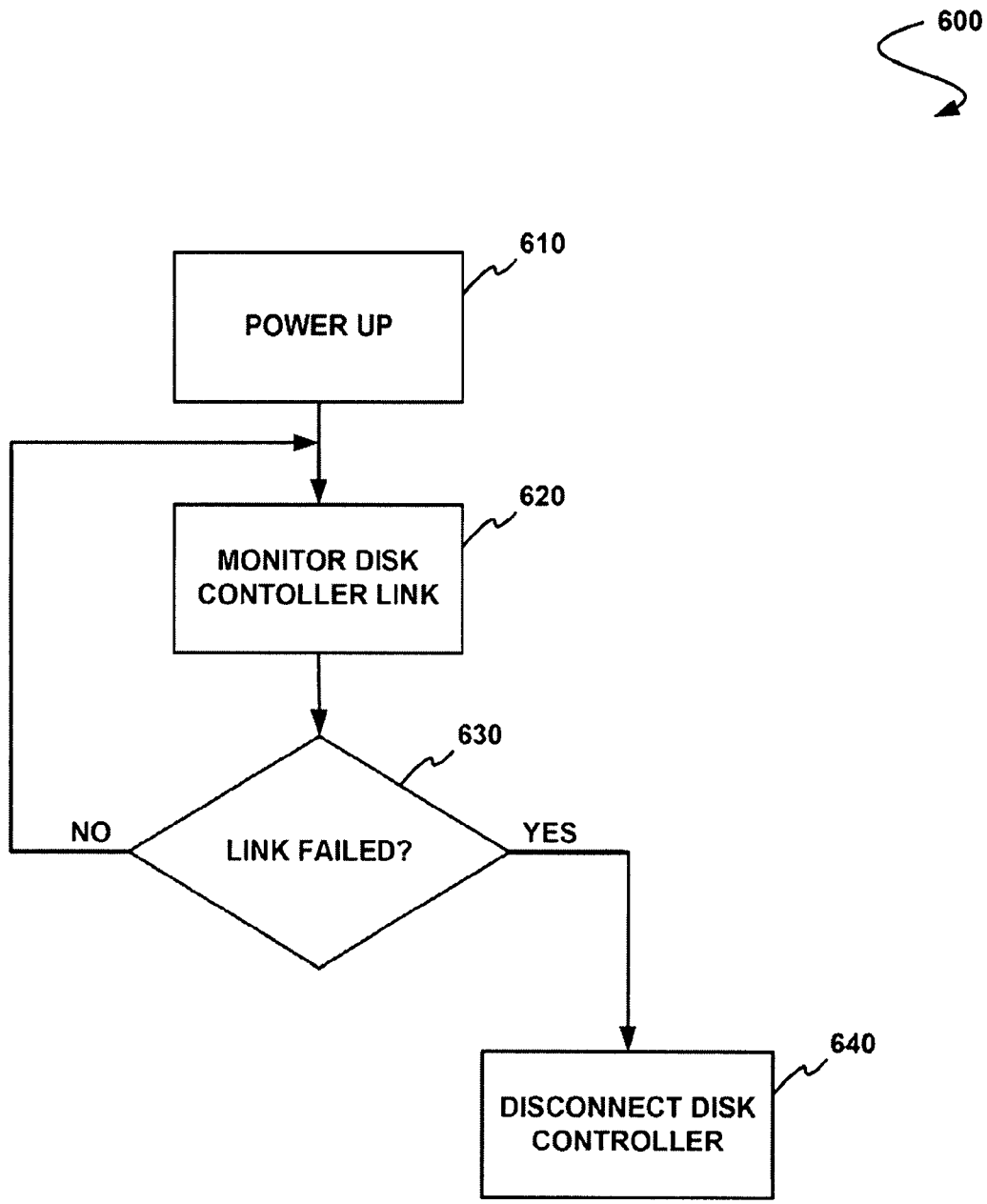
FIG. 6 shows a method for operating a redundant disk controller, in accordance with another embodiment.

FIG. 6 shows a method 600 for operating a redundant disk controller, in accordance with another embodiment. As an option, the present method 600 may be implemented in the context of the functionality and architecture of FIGS. 1-5. Of course, however, the method 600 may be carried out in any desired environment. It should also be noted that the aforementioned definitions may apply during the present description.

As shown, a storage system (e.g. a disk assembly, etc.) is powered up. See operation 610. A link between at least two disk controllers of the storage system is monitored. See operation 620. In one embodiment, the link between the disk controllers may include the disk controller bus 203 of FIG. 2B. Additionally, the link between the disk controllers may be monitored by at least one of the disk controllers (e.g. the first and second disk controller 210 and 220 of FIG. 2B, etc.).

The storage system continues to operate, monitoring the link, until it is determined that the link has failed. See operation 630. If the link fails, then one disk controller is disconnected. See operation 640.

In one embodiment, the disconnection may include disconnecting busses linking a disk controller to the storage devices (e.g. connections 211-214 or 221-224 of FIG. 2B, etc). In this case, commands received by a port associated with the disconnected controller may not be processed. As an example, a second of two disk controllers may be disconnected upon a failure of the link between a first and the second disk controller. In this case, the first controller may continue operating and commands from the ports of the second disk controller may not be processed.

Figure 7:
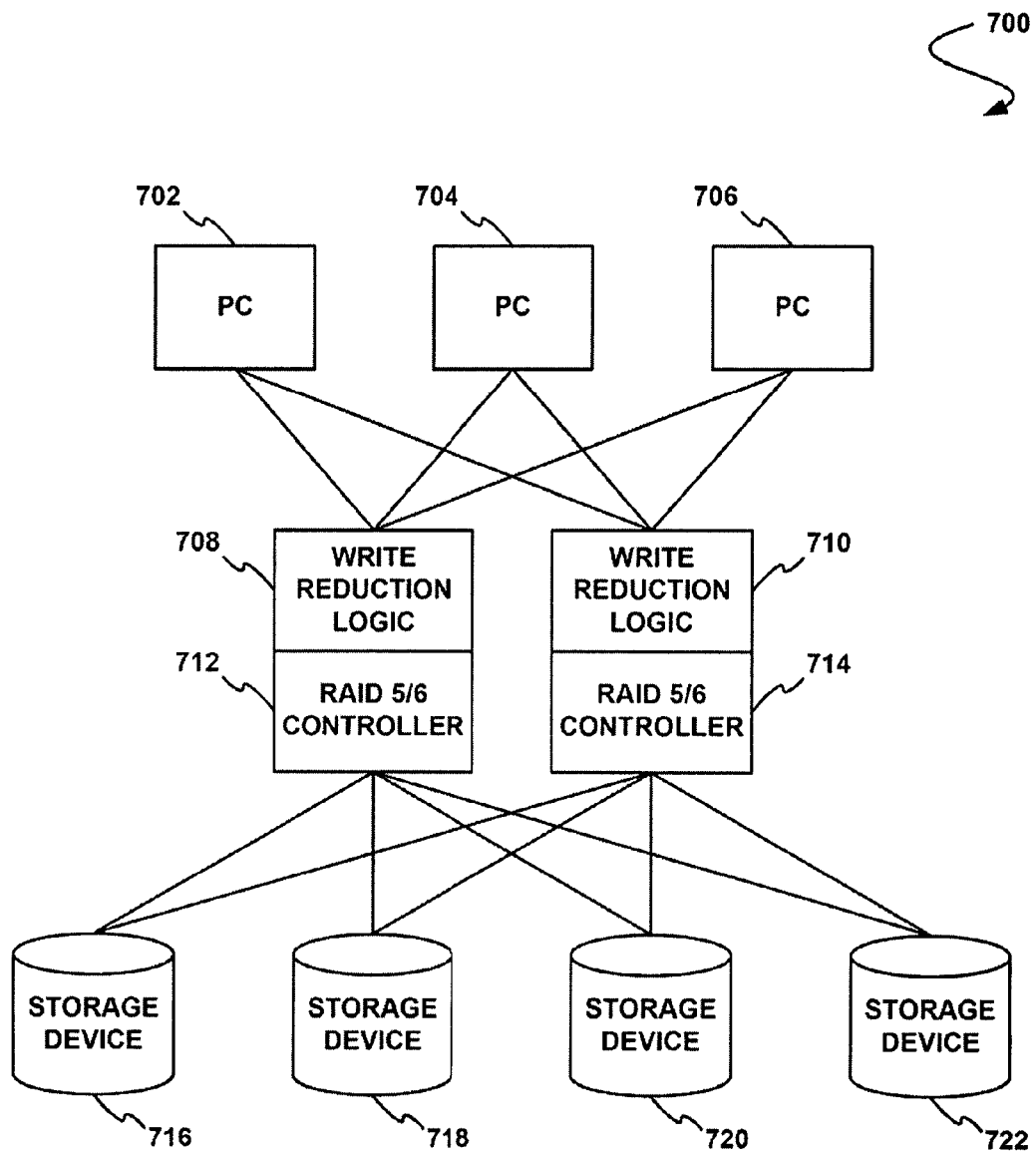
FIG. 7 shows a system for operating a redundant disk controller, in accordance with another embodiment.

FIG. 7 shows a system 700 for operating a redundant disk controller, in accordance with another embodiment. As an option, the system 700 may be implemented in the context of the functionality and architecture of FIGS. 1-6. Of course, however, the system 700 may be implemented in any desired environment. It should also be noted that the aforementioned definitions may apply during the present description.

As shown, at least one computer 702-706 is provided. The computers 702-706 are coupled to a plurality of RAID controllers 712-714. The controllers 712-714 are in communication with a plurality of storage devices 716-722. Such communication may include utilizing ports associated with the storage devices 716-722.

Reliability of the system 700 may be achieved by using storage devices 716-722 with intra-drive redundancy (e.g. the storage system 250 of FIG. 2B). Furthermore, all connections (e.g. busses, etc.) may be duplicated to ensure reliability of the system 700. As an option, the storage devices 716-722 may each include two ports per device, providing twice as much bandwidth compared to use of a storage device with a single port. Furthermore, each storage device 716-722 may simulate two disks by utilizing a redundancy system such as RAID 5, RAID 6, RAID 10, RAID 50, RAID 60, square parity redundancy schemas, etc.

As an option, write reduction logic 708-710 may be utilized to reduce a number of writes to the storage devices 716-722. In this case, translating storage commands for providing data redundancy may be performed after the reducing. For example, storage commands may be received for providing data redundancy in accordance with a first data redundancy scheme (e.g. RAID 5, RAID 6, RAID 10, RAID 50, RAID 60, square parity redundancy schemas, etc.) of the controllers 712-714.

The write reduction logic 708-710 may then be utilized to reduce a number of writes to the storage devices 716-722. The storage commands may then be translated (e.g. by a circuit) for providing the data redundancy in accordance with a second data redundancy scheme associated with the storage devices 716-722. In one embodiment, the second data redundancy scheme may be the same as the first data redundancy scheme (e.g. RAID 5, RAID 6, RAID 10, RAID 50, RAID 60, square parity redundancy schemas, etc.). In another embodiment, the second data redundancy scheme may be different than the first data redundancy scheme (e.g. RAID 1, RAID 6, RAID 10, RAID 50, RAID 60, square parity redundancy schemas, etc).

In one embodiment, the write reduction logic 708-710 may be utilized to format storage commands that are received for providing data redundancy in accordance with a first data redundancy scheme into a format compatible with the second data redundancy scheme. Strictly as an option, the RAID controllers 712-714 may include a system with intra-drive redundancy as described in the context of the storage devices 716-722. In this way, a number of writes to the storage devices 716-722 may be reduced. Thus, the storage commands may be translated for providing the data redundancy in accordance with a second data redundancy scheme associated with the storage devices 716-722 after the reduction of the number of writes. In this way, randomization of data may be avoided.

Figure 8:
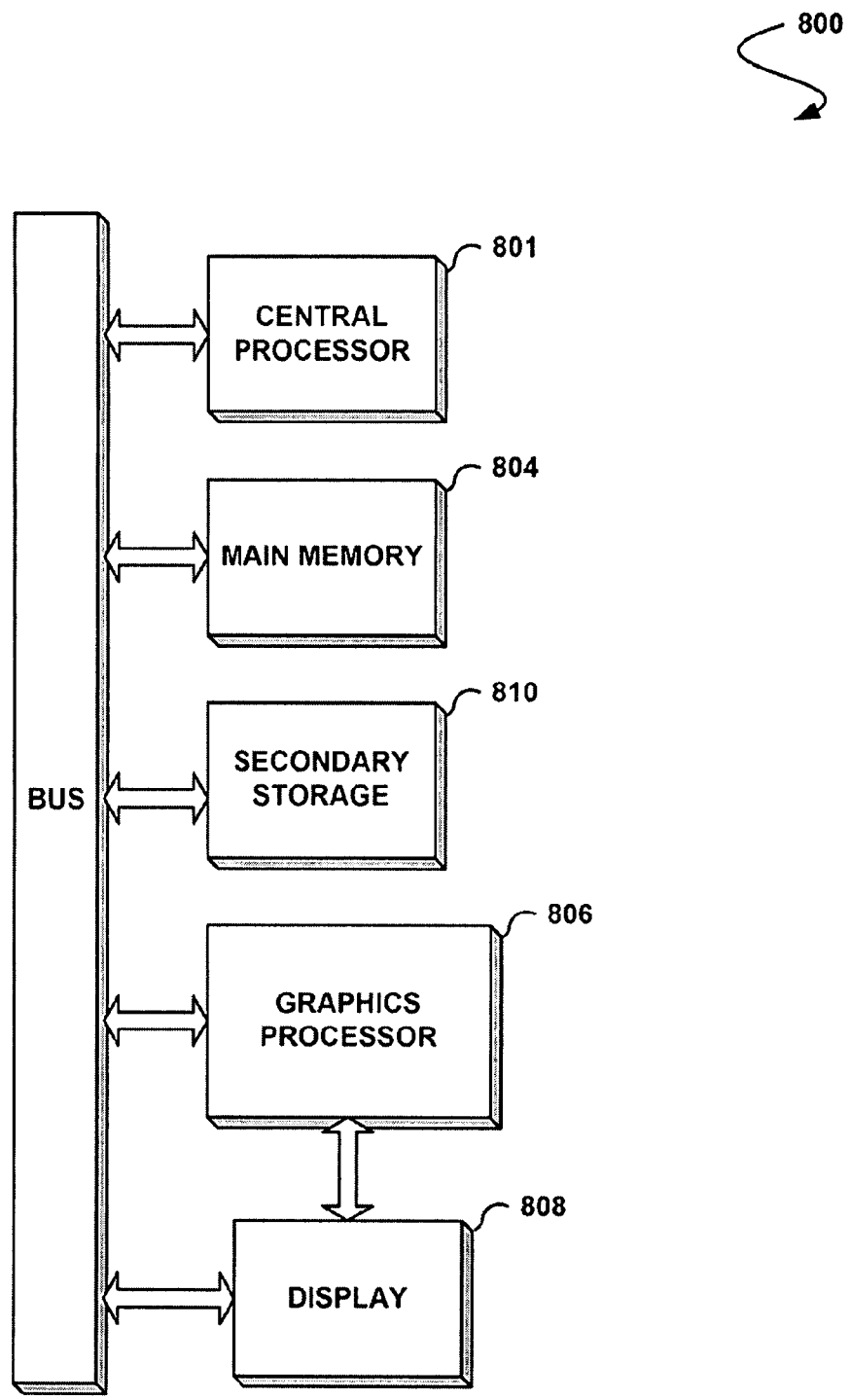
FIG. 8 illustrates an exemplary system in which the various architecture and/or functionality of the various previous embodiments may be implemented.

FIG. 8 illustrates an exemplary system 800 in which the various architecture and/or functionality of the various previous embodiments may be implemented. As shown, a system 800 is provided including at least one host processor 801 which is connected to a communication bus 802. The system 800 also includes a main memory 804. Control logic (software) and data are stored in the main memory 804 which may take the form of random access memory (RAM).

The system 800 also includes a graphics processor 806 and a display 808, i.e. a computer monitor. In one embodiment, the graphics processor 806 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 800 may also include a secondary storage 810. The secondary storage 810 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 804 and/or the secondary storage 810. Such computer programs, when executed, enable the system 800 to perform various functions. Memory 804, storage 810 and/or any other storage are possible examples of computer-readable media.

In one embodiment, the architecture and/or functionality of the various previous figures may be implemented in the context of the host processor 801, graphics processor 806, secondary storage 810, an integrated circuit (not shown) that is capable of at least a portion of the capabilities of both the host processor 801 and the graphics processor 806, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 800 may take the form of a desktop computer, lap-top computer, and/or any other type of logic. Still yet, the system 800 may take the form of various other devices including, but not limited to, a personal digital assistant (PDA) device, a mobile phone device, a television, etc.

Further, while not shown, the system 800 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   receiving writes from a computer via a standard storage subsystem interface;
   reducing a number of the received writes; implementing, via a disk controller, a data redundancy scheme comprising storing data associated with the reduced number of writes in a plurality of primary flash memories and storing computed redundant information in at least one redundant flash memory; and
   wherein the disk controller is enabled to operate without a loss of data in the presence of at least a single failure of any of the flash memories.

2. The method as recited in claim 1, wherein the data redundancy scheme includes a redundant array of independent disks (RAID) data redundancy scheme.

3. The method as recited in claim 2, wherein the data redundancy scheme includes a redundant array of independent disks (RAID)-5 data redundancy scheme.

4. The method as recited in claim 2, wherein the data redundancy scheme includes a redundant array of independent disks (RAID)-6 data redundancy scheme.

5. The method as recited in claim 1, wherein the standard storage subsystem interface comprises a SATA interface.

6. The method as recited in claim 5, wherein the disk controller is included in a disk drive.

7. The method as recited in claim 1, wherein the storage subsystem interface comprises a SAS interface.

8. The method as recited in claim 7, wherein the disk controller is included in a disk drive.

9. The method as recited in claim 1, wherein at least one of the flash memories comprises NAND flash memory.

10. The method as recited in claim 9, wherein the NAND flash memory includes single-level cell (SLC) NAND flash memory.

11. The method as recited in claim 9, wherein the NAND flash memory includes multi-level cell (MLC) NAND flash memory.

12. The method as recited in claim 1, wherein the flash memories are included in a disk drive.

13. The method as recited in claim 1, and further comprising detecting a disconnection of a power source of the disk controller.

14. The method as recited in claim 13, and further comprising providing power to the disk controller, in response to the detection of the disconnection of the power source.

15. The method as recited in claim 14, wherein power is provided to the disk controller until at least a point when no data loss will occur as a result of the disconnection of the power source.

16. The method as recited in claim 15, wherein the power is provided utilizing a capacitor.

17. The method as recited in claim 15, wherein the power is provided utilizing a battery.

18. The method as recited in claim 1, wherein the disk controller and the flash memories are included in a disk drive.

19. A computer program product embodied on a computer readable medium, comprising:
   computer code for reducing a number of writes to a storage subsystem;
   computer code for providing data redundancy utilizing a data redundancy scheme, after the reducing; and
   wherein the writes are received from a computer via a standard storage subsystem interface, the data redundancy scheme is implemented by a disk controller and comprises storing data associated with the reduced number of writes in a plurality of primary flash memories and storing computed redundant information in at least one redundant flash memory, and the disk controller is enabled to operate without a loss of data in the presence of at least a single failure of any of the flash memories.

20. An apparatus, comprising:
   a circuit enabled to receive writes from a computer via a standard storage subsystem interface, and further enabled to reduce a number of the received writes;
   a disk controller that implements a data redundancy scheme comprising storing data associated with the reduced number of writes in a plurality of primary flash memories and storing computed redundant information in at least one redundant flash memory; and
   wherein the disk controller is enabled to operate without a loss of data in the presence of at least a single failure of any of the flash memories.

21. The apparatus as recited in claim 20, and further comprising a the primary and the redundant flash memories.

* * * * *